US012783029B2

(12) United States Patent
Mason

(10) Patent No.: US 12,783,029 B2
(45) **Date of Patent: *Nov. 3, 2026**

(54) PRINTED CIRCUITS WITH EMBEDDED RESISTIVE THERMAL DEVICES

(71) Applicant: Apple Inc., Cupertino, CA (US)

(72) Inventor: Anne M. Mason, Palo Alto, CA (US)

( * ) Notice: Subject to any disclaimer, the term of this patent is extended or adjusted under 35 U.S.C. 154(b) by 78 days.

This patent is subject to a terminal disclaimer.

(21) Appl. No.: 18/903,894

(22) Filed: Oct. 1, 2024

(65) Prior Publication Data

US 2025/0036176 A1 Jan. 30, 2025

Related U.S. Application Data

(63) Continuation of application No. 18/473,567, filed on Sep. 25, 2023, now Pat. No. 12,135,592, which is a (Continued)

(51) Int. Cl.

| | |
|---|---|
| ***G06F 1/20*** | (2006.01) |
| ***G01K 3/00*** | (2006.01) |
| ***G01K 7/16*** | (2006.01) |
| ***G01L 1/22*** | (2006.01) |
| ***G06F 1/18*** | (2026.01) |
| ***G06F 1/32*** | (2019.01) |

(Continued)

(52) U.S. Cl.

CPC ............ *G06F 1/206* (2013.01); *G01K 3/005* (2013.01); *G01K 7/16* (2013.01); *G01L 1/22* (2013.01); *G06F 1/181* (2013.01); *G06F 1/32* (2013.01); *H05K 1/0353* (2013.01); *H05K 1/09* (2013.01); *H05K 1/111* (2013.01); *H05K 1/185* (2013.01); *H05K 2201/0154* (2013.01); *H05K 2201/10151* (2013.01)

(58) Field of Classification Search

CPC .......... G06F 1/181; G06F 1/203; G06F 1/206; G06F 1/32; G01K 3/005; G01K 7/16; G01K 7/18; G01L 1/22; H05K 1/0201; H05K 1/0268; H05K 1/0271; H05K 1/0353; H05K 1/09; H05K 1/111; H05K 1/167; H05K 1/185; H05K 2201/0154; H05K 2201/09263; H05K 2201/10151

See application file for complete search history.

(56) References Cited

U.S. PATENT DOCUMENTS

| | | | |
|---|---|---|---|
| 5,108,825 | A | 4/1992 | Wojnarowski et al. |
| 9,593,991 | B2 | 3/2017 | Mason et al. |

(Continued)

*Primary Examiner* — Terrell S Johnson

(74) *Attorney, Agent, or Firm* — Treyz Law Group, P.C.; Michael H. Lyons

(57) ABSTRACT

An electronic device may include a printed circuit with a surface-mounted component. The component may produce resistive heating within the printed circuit. Resistive thermal devices (RTDs) may be embedded within the printed circuit. An RTD may at least partially overlap the electrical component. The RTD may include contact pads on a flexible substrate and a meandering conductive trace between the contact pads. The trace may have a resistance varying linearly as a function of temperature. A data acquisition system (DAQ) may measure the resistance of the RTD. Control circuitry may identify the temperature of the printed circuit based on the resistance of the RTD measured by the DAQ and may reduce power consumption by the component when the temperature exceeds a threshold. This may serve to prevent overheating in the printed circuit over time, thereby maximizing the operating life of the printed circuit.

20 Claims, 10 Drawing Sheets

Related U.S. Application Data continuation of application No. 17/224,891, filed on Apr. 7, 2021, now Pat. No. 11,971,760.

(51) Int. Cl.

| | |
|---|---|
| ***H05K 1/03*** | (2006.01) |
| ***H05K 1/09*** | (2006.01) |
| ***H05K 1/11*** | (2006.01) |
| ***H05K 1/185*** | (2026.01) |

(56) References Cited

U.S. PATENT DOCUMENTS

| | | | |
|---|---|---|---|
| 2002/0139575 | A1 | 10/2002 | Fartash et al. |
| 2011/0073668 | A1 | 3/2011 | Garber |
| 2012/0076171 | A1 | 3/2012 | Wu |
| 2012/0133427 | A1 | 5/2012 | Kim et al. |

PRINTED CIRCUITS WITH EMBEDDED RESISTIVE THERMAL DEVICES

This application is a continuation of U.S. patent application Ser. No. 18/473,567, filed Sep. 25, 2023, which is a continuation of U.S. patent application Ser. No. 17/224,891, filed Apr. 7, 2021, each of which is hereby incorporated by reference herein in its entirety.

FIELD

This disclosure relates generally to electronic devices and, more particularly, to electronic devices with temperature sensors.

BACKGROUND

Electronic devices such as cellular telephones, computers, and other electronic devices contain integrated circuits and other electrical components. Components such as these may be mounted on printed circuits. During operation, the components draw current/power that increases the temperature at one or more locations within the electronic device. If care is not taken, the printed circuits, components, and/or other portions of the electronic device can be subjected to overheating.

SUMMARY

An electronic device may include a printed circuit and an electrical component mounted to a surface of the printed circuit. The electrical component may transmit and/or receive signals via the printed circuit. Each electrical component is powered using power and ground connections. The power and ground connections typically draw a large amount of current that produces resistive heating within the printed circuit. In order to measure resistive heating within the printed circuit, one or more resistive thermal devices (RTDs) may be embedded within the printed circuit. RTDs may additionally or alternatively be adhered to an exterior surface of the printed circuit. The RTDs may be located at resistive heating hotspots on the printed circuit. An RTD may, for example, at least partially overlap the electrical component.

The RTD may include first and second contact pads on a flexible substrate. The RTD may include a meandering conductive trace extending from the first contact pad to the second contact pad. The meandering conductive trace may be formed from a material having a resistance that varies linearly as a function of temperature across the operating temperatures of the printed circuit. The material can include nickel, nickel-iron, or platinum, as examples. The flexible substrate may have a very narrow thickness, such as a thickness less than or equal to 50 microns. This may allow the RTD to be embedded within the printed circuit. Conductive vias may be used to couple the contact pads to a data acquisition system (DAQ) that is mounted to the printed circuit or disposed elsewhere in the device.

The DAQ may include power supply terminals and reference resistors for a bridge circuit that includes the RTD. The DAQ may measure the resistance of the RTD. One or more processors may identify the temperature of the printed circuit at the location of the RTD based on the resistance of the RTD measured by the DAQ. The one or more processors may reduce activity or power consumption by the electrical component when the temperature exceeds a threshold temperature. In this way, the one or more processors can monitor points on the printed circuit most prone to resistive heating (e.g., locations within the interior of the printed circuit)—points which are otherwise inaccessible to surface-mount temperature sensors. This may serve to prevent overheating in the printed circuit over time, thereby maximizing the operating life of the printed circuit.

An aspect of the disclosure provides an electronic device. The electronic device can include a printed circuit having a surface. The electronic device can include an electrical component mounted to the surface of the printed circuit. The electronic device can include a resistive thermal device (RTD) embedded within the printed circuit. The electronic device can include one or more processors. The one or more processors can be configured to measure a resistance of the RTD. The one or more processors can identify a temperature of the printed circuit based on the measured resistance of the RTD.

An aspect of the disclosure provides a method of operating an electronic device having a printed circuit, a resistive thermal device (RTD) embedded within the printed circuit, a data acquisition system (DAQ) coupled to the RTD over conductive vias in the printed circuit, an electrical component mounted to the printed circuit, and one or more processors. The method can include, with the DAQ, measuring a resistance of the RTD. The method can include, with the one or more processors, identifying a temperature within the printed circuit based on the resistance of the RTD measured by the DAQ. The method can include, with the one or more processors, reducing power consumption by the electrical component when the identified temperature exceeds a threshold temperature.

An aspect of the disclosure provides a printed circuit having a range of operating temperatures. The printed circuit can be configured to receive a surface-mount electrical component that produces resistive heating in the printed circuit. The printed circuit can include stacked dielectric layers. The printed circuit can include stacked metal layers interleaved with the stacked dielectric layers. The printed circuit can include a substrate having a thickness less than 50 microns. The printed circuit can include a first contact pad and a second contact pad on the substrate. The printed circuit can include a conductive trace on the substrate that extends from the first contact pad to the second contact pad. The conductive trace can have a resistance that varies linearly as a function of temperature across the range of operating temperatures of the printed circuit. The conductive trace can have a length that configures the conductive trace to exhibit a nominal resistance at a predetermined temperature.

DETAILED DESCRIPTION

Figure 1:
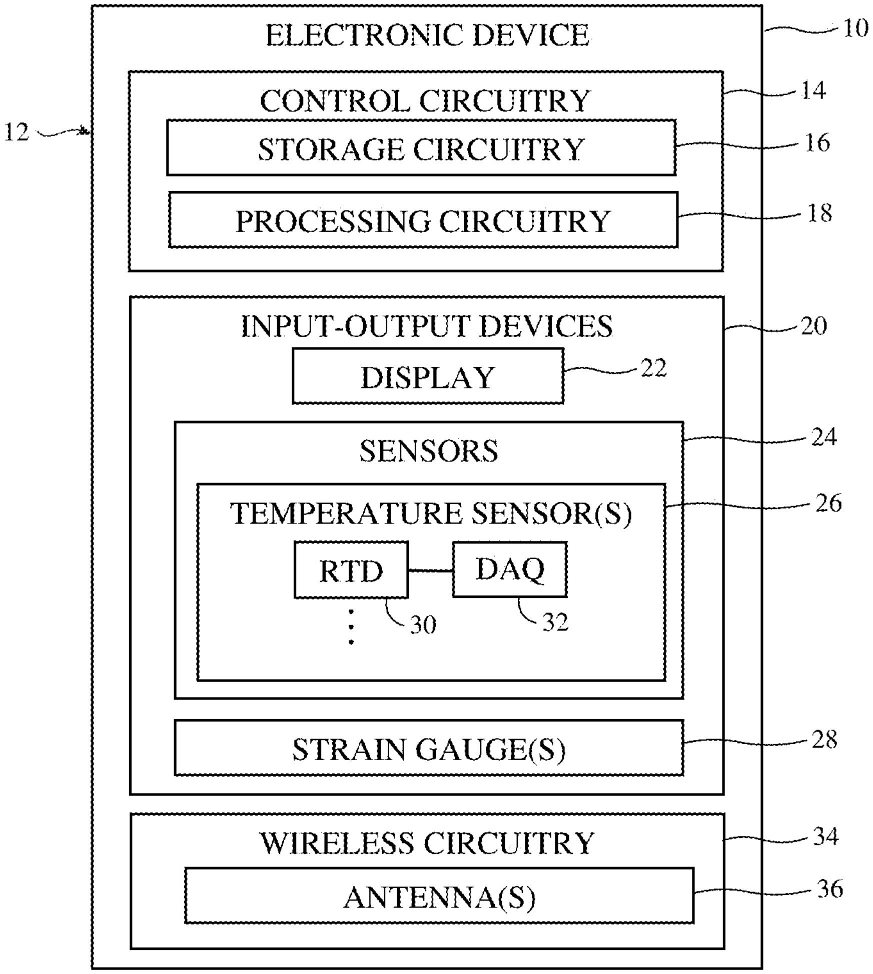
FIG. 1 is a functional block diagram of an illustrative electronic device having a temperature sensor with a resistive thermal device (RTD) in accordance with some embodiments.

An illustrative electronic device of the type that may be provided with a printed circuit board having a resistive thermal device (RTD) is shown in FIG. 1. Electronic device 10 of FIG. 1 may be a computing device such as a laptop computer, a desktop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a wireless internet-connected voice-controlled speaker, a home entertainment device, a remote control device, a gaming controller, a peripheral user input device (e.g., a wireless track pad, wireless mouse, wireless keyboard, a peripheral device that combines two or more of these functions, etc.), a wireless base station or access point, equipment that implements the functionality of two or more of these devices, or other electronic equipment.

As shown in the functional block diagram of FIG. 1, device 10 may include components located on or within an electronic device housing such as housing 12. Housing 12, which may sometimes be referred to as a case, may be formed of plastic, glass, ceramics, fiber composites, metal (e.g., stainless steel, aluminum, metal alloys, etc.), other suitable materials, or a combination of these materials. In some situations, parts or all of housing 12 may be formed from dielectric or other low-conductivity material (e.g., glass, ceramic, plastic, sapphire, etc.). In other situations, housing 12 or at least some of the structures that make up housing 12 may be formed from metal elements.

Device 10 may include control circuitry 14. Control circuitry 14 may include storage such as storage circuitry 16. Storage circuitry 16 may include hard disk drive storage, nonvolatile memory (e.g., flash memory or other electrically-programmable-read-only memory configured to form a solid-state drive), volatile memory (e.g., static or dynamic random-access-memory), etc. Storage circuitry 16 may include storage that is integrated within device 10 and/or removable storage media.

Control circuitry 14 may include processing circuitry such as processing circuitry 18. Processing circuitry 18 may be used to control the operation of device 10. Processing circuitry 18 may include on one or more microprocessors, microcontrollers, digital signal processors, host processors, baseband processor integrated circuits, application specific integrated circuits, central processing units (CPUs), etc. Control circuitry 14 may be configured to perform operations in device 10 using hardware (e.g., dedicated hardware or circuitry), firmware, and/or software. Software code for performing operations in device 10 may be stored on storage circuitry 16 (e.g., storage circuitry 16 may include non-transitory (tangible) computer readable storage media that stores the software code). The software code may sometimes be referred to as program instructions, software, data, instructions, or code. Software code stored on storage circuitry 16 may be executed by processing circuitry 18.

Control circuitry 14 may be used to run software on device 10 such as satellite navigation applications, internet browsing applications, voice-over-internet-protocol (VOIP) telephone call applications, email applications, media playback applications, operating system functions, etc. To support interactions with external equipment, control circuitry 14 may be used in implementing communications protocols. Communications protocols that may be implemented using control circuitry 14 include internet protocols, wireless local area network (WLAN) protocols (e.g., IEEE 802.11 protocols-sometimes referred to as Wi-Fi®), protocols for other short-range wireless communications links such as the Bluetooth® protocol or other wireless personal area network (WPAN) protocols, IEEE 802.11ad protocols (e.g., ultra-wideband protocols), cellular telephone protocols (e.g., 3G protocols, 4G (LTE) protocols, 5G protocols, etc.), antenna diversity protocols, satellite navigation system protocols (e.g., global positioning system (GPS) protocols, global navigation satellite system (GLONASS) protocols, etc.), antenna-based spatial ranging protocols (e.g., radio detection and ranging (RADAR) protocols or other desired range detection protocols for signals conveyed at millimeter and centimeter wave frequencies), or any other desired communications protocols. Each communications protocol may be associated with a corresponding radio access technology (RAT) that specifies the physical connection methodology used in implementing the protocol. Input-output circuitry in device 10 such as input-output devices 20 may be used to allow data to be supplied to device 10 and to allow data to be provided from device 10 to external devices. Input-output devices 20 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 20 and may receive status information and other output from device 10 using the output resources of input-output devices 20. In some configurations, keyboards, headphones, displays, pointing devices such as trackpads, mice, and joysticks, and other input-output devices may be coupled to device 10 using wired or wireless connections (e.g., some of input-output devices 20 may be peripherals that are coupled to a main processing unit or other portion of device 10 via a wired or wireless link).

Input-output devices 20 may include one or more displays such as display 22. Display 22 may be a touch screen display that includes a touch sensor for gathering touch input from a user or display 22 may be insensitive to touch. A touch sensor for display 22 may be based on an array of capacitive touch sensor electrodes, acoustic touch sensor structures, resistive touch components, force-based touch sensor structures, a light-based touch sensor, or other suitable touch sensor arrangements.

Input-output devices 20 may also include sensors 24. Sensors 24 may include one or more strain gauge sensors 28 and other sensors such as proximity sensors, ambient light sensors, touch sensors, force sensors, temperature sensors, pressure sensors, magnetic sensors, and other sensors. Strain gauge sensors 28 may include sensors mounted on the surfaces of a printed circuit board and/or embedded within a printed circuit board. In order to measure the temperature at one or more points on and/or within device 10, sensors 24 may include one or more temperature sensors such as temperature sensor 26.

If desired, the input-output circuitry in device 10 may also include wireless circuitry 34 to support wireless communications and/or radio-based spatial ranging operations. Wireless circuitry 34 may include one or more antennas 36. Wireless circuitry 34 may also include baseband processor circuitry, transceiver circuitry, amplifier circuitry, filter circuitry, switching circuitry, analog-to-digital converter (ADC) circuitry, digital-to-analog converter (DAC) circuitry, radio-frequency transmission lines, and/or any other circuitry for transmitting and/or receiving radio-frequency signals using antennas 36.

Wireless circuitry 34 may use antenna(s) 36 to perform wireless communications within corresponding frequency bands at radio frequencies (sometimes referred to herein as a communications band or simply as a "band"). The frequency bands handled by wireless circuitry 34 may include wireless local area network (WLAN) frequency bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHZ), and/or other Wi-Fi® bands (e.g., from 1875-5160 MHZ), wireless personal area network (WPAN) frequency bands such as the 2.4 GHz Bluetooth® band or other WPAN communications bands, cellular telephone frequency bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), other centimeter or millimeter wave frequency bands between 10-300 GHz, near-field communications frequency bands (e.g., at 13.56 MHZ), satellite navigation frequency bands (e.g., a GPS band from 1565 to 1610 MHz, a Global Navigation Satellite System (GLONASS) band, a BeiDou Navigation Satellite System (BDS) band, etc.), ultra-wideband (UWB) frequency bands that operate under the IEEE 802.15.4 protocol and/or other ultra-wideband communications protocols, communications bands under the family of 3GPP wireless communications standards, communications bands under the IEEE 802.XX family of standards, and/or any other desired frequency bands of interest.

Control circuitry 14 may be used to run software on device 10 such as operating system code and applications. During operation of device 10, the software running on control circuitry 14 may be used in gathering temperature sensor data (e.g., temperature measurements) from temperature sensor(s) 26 and in gathering strain gauge data from strain gauge(s) 28. Strain gauge data may be analyzed during failure analysis (e.g., to help designers improve the design of a device and the printed circuits and other components within the device), may be monitored in real time to issue alerts and provide other information to a user or others, and/or may be used to take other suitable action in device 10.

Some or all of control circuitry 14 (e.g., one or more CPUs, a system-on-chip (SOC), etc.), wireless circuitry 34, input-output devices 20, and/or other electrical components in device 10 may be mounted to substrates such as one or more printed circuits. The printed circuits may include rigid printed circuit boards and flexible printed circuits. These electrical components are powered and draw current during use (e.g., the electrical components have power and ground connections that draw relatively high amounts of current). Power density and current density can change rapidly depending on the size of the load. Current drawn by electrical components such as a CPU or SOC is higher when performing intensive calculations and lower when performing less-intensive activities. The rate of change of the current from low to high leads to increased resistive (Ohmic) heating on the printed circuit and within device 10, thereby increasing the temperature of the printed circuit and the interior of device 10.

Temperature detection within device 10 is important to preventative reliability in device 10. Sensing temperature may allow for the electrical components (e.g., control circuitry 14) to throttle the load, thus decreasing the current drawn to limit the resistive heat generated in device 10. If the temperature within device 10 is not known, the printed circuit may be subjected to overheating. The lifespan of the printed circuit may be decreased by cycles of heating/overheating and cooling, which can have long term effects on the materials in the stack up of the printed circuit.

The printed circuit generally includes multiple stacked dielectric layers interspersed with metallization layers. Resistive heating may be particularly pronounced at certain points within the printed circuit (e.g., at the dielectric or metallization layers near the center of the printed circuit stack up, beneath the power/ground connections of highly active components, etc.). In some scenarios, temperature sensor 26 is soldered to a surface of the printed circuit using surface-mount technology (SMT) (e.g., as an SMT temperature sensor). While SMT temperature sensors may measure the temperature at a surface of the printed circuit, SMT temperature sensors are typically unable to measure temperature at points within the interior of the printed circuit where resistive heating is most pronounced. In addition, SMT temperature sensors are bulky and are generally unable to be placed at pin-point areas around critical electrical components on the printed circuit (e.g., voltage regulators, processors, memory, etc.) where power density and thus resistive heat is highest. In some scenarios, the temperature sensor may be adhered or glued to the surface of the printed circuit after the SMT process using tape or glue. However, this typically requires either unused board area or relatively long distances between the temperature sensor and the point of interest, and may undesirably change position in heated environments. In order to mitigate these issues to allow for precise temperature measurements within the printed circuit while mitigating the printed circuit area used for measuring temperature, temperature sensor 26 may include one or more resistive thermal devices such as resistive thermal device (RTD) 30. RTD 30 may be embedded within the layers of the printed circuit and/or placed at a surface of the printed circuit. RTD 30 may sometimes also be referred to as a resistive temperature device, resistive thermal detector, resistive temperature detector, resistance thermal device, resistance temperature device, resistance thermal detector, resistance temperature detector, resistive thermometer, or resistance thermometer.

RTD 30 may include a conductive material (e.g., a conductive trace, metal foil, etc.) on an underlying substrate. The temperature coefficient of resistance (TCR) of the conductive material, denoted by the Greek letter $\alpha$ in units of Ohms/Ohms*° C., is defined by the equation $\alpha=[R_{100}-R_0]/[100-R_0]$, where Rico is the resistance of the conductive material at 100° C. and $R_0$ is the resistance of the conductive material at 0° C. The conductive material in RTD 30 may exhibit a linear TCR ($\alpha$) as a function of temperature over the expected temperature range of operation for the printed circuit (e.g., from −50° C. to 150° C. or other temperature ranges). Examples of such conductive materials that may be used to form RTD 30 include metals such as Nickel (Ni) or platinum (Pt) and alloys such as Nickel-Iron (Ni—Fe). RTD 30 may occupy a very small amount of space on the printed circuit. For example, RTD 30 may be thin enough to be placed between the layers of the printed circuit with nearly infinite lateral placement flexibility within the printed circuit. RTD 30 may be manufacturing using a silicon die wafer packaging manufacturing process or using any other desired processes.

In general, the resistance of RTD 30 changes as a function of temperature. Temperature sensor 26 may include a data acquisition system (DAQ) 32 coupled to RTD 30. DAQ 32 may measure temperature on the printed circuit by measuring the resistance of RTD 30. DAQ 32 may include one or more amplifiers, differential amplifiers, bridge circuit components (e.g., reference resistors), comparators, digital logic, analog circuitry, analog-to-digital converters (ADCs), power supply voltage sources, switching circuits, and/or any other desired components for measuring the resistance of RTD 30 and thus the temperature of the printed circuit. Temperature sensor 26 may include any desired number of RTDs 30 on one or more printed circuits in device 10. Using multiple RTDs 30 may allow temperature sensor 26 to measure and track the temperature of multiple points within the printed circuit (e.g., the points on the printed circuit most subject to resistive heating). The resistance of each RTD 30 may be measured by the same DAQ 32 or each RTD 30 may be read by a respective DAQ 32. If desired, DAQ 32 may also be used to gather strain gauge data using strain gauge(s) 28.

The example of FIG. 1 is merely illustrative. While control circuitry 14 is shown separately from temperature sensor 26 in the example of FIG. 1 for the sake of clarity, DAQ 32 may include processing circuitry that forms a part of processing circuitry 18 (e.g., DAQ 32 may include one or more processors) and/or storage circuitry that forms a part of storage circuitry 16 (e.g., portions of control circuitry 14 may be implemented on DAQ 32). While temperature sensor 26 is shown separate from display 22 and wireless circuitry 34 for the sake of clarity, RTD 30 may form a part of display 22 and/or a part of wireless circuitry 34. For example, RTD 30 may be formed on a printed circuit that feeds display signals to display 22 (e.g., a display flex) or that otherwise forms a part of display 22. As another example, RTD 30 may be formed on a printed circuit in a radio-frequency front end (RFFE) module of wireless circuitry 34, on a printed circuit used to support a transceiver and/or baseband processor in wireless circuitry 34, on a printed circuit that is used to form one or more radio-frequency transmission lines for wireless circuitry 34, on a printed circuit that is used to support one or more antennas 36, etc. Wireless circuitry 34 and/or display 22 may be omitted if desired.

Figure 2:
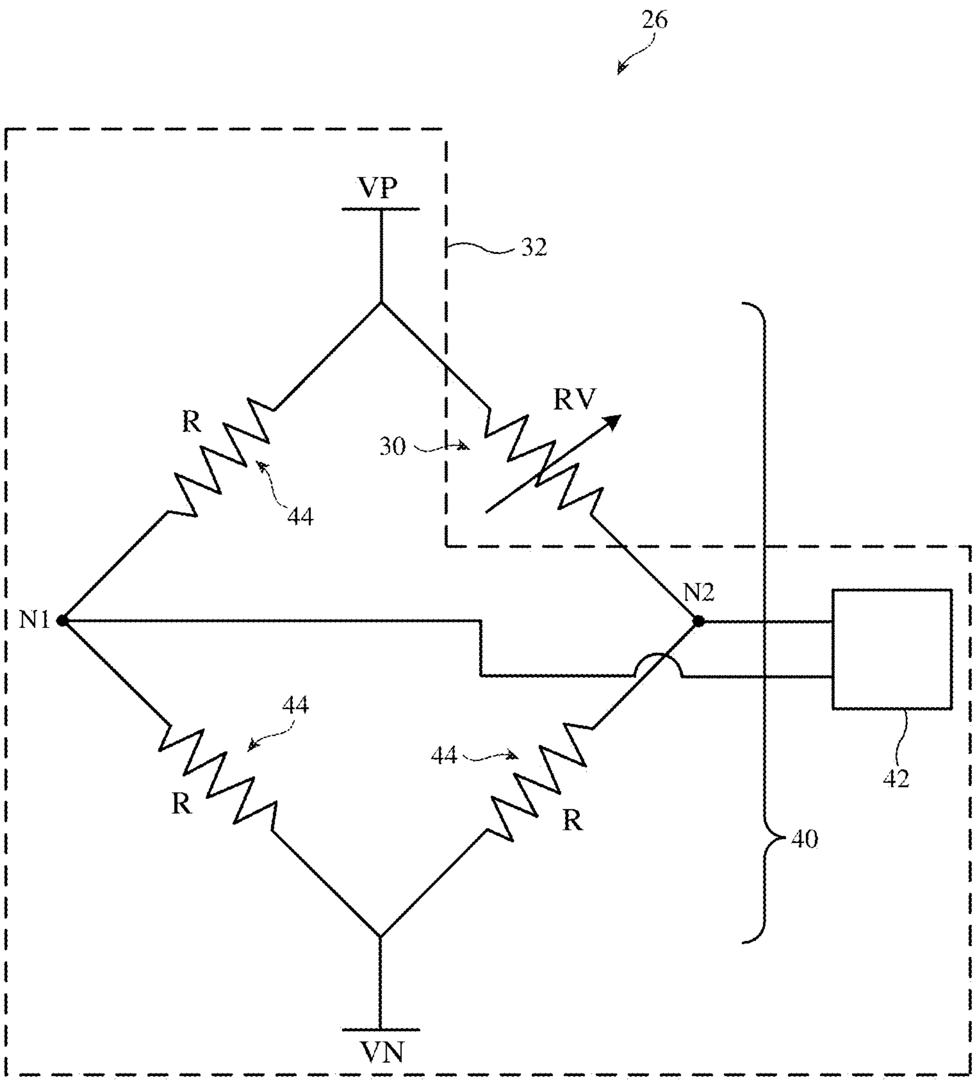
FIG. 2 is a circuit diagram of an illustrative temperature sensor having a bridge circuit that includes an RTD for measuring temperature in accordance with some embodiments.

FIG. 2 is a circuit diagram of illustrative temperature sensor circuitry having RTD 30 on a printed circuit. Temperature sensor 26 may include a bridge circuit (e.g., a Wheatstone bridge) such as bridge circuit 40. Bridge circuit 40 may include reference resistors 44 and RTD 30. Reference resistors 44 may each have a known resistance R (e.g., each reference resistor 44 may have the same resistance or two or more of the reference resistors may have different resistances). RTD 30 has a resistance RV that varies as a function of temperature (e.g., linearly over the operating temperatures of the printed circuit) and therefore serves as a temperature sensing element. The illustrative bridge circuitry of FIG. 2 includes one RTD 30 and three reference resistors 44, but configurations with two RTDs 30 and two reference resistors 44 or other combinations of reference resistors 44 and RTDs 30 may be used, if desired.

Power supply terminals VP and VN may respectively apply a positive power supply voltage and a ground power supply voltage to bridge circuit 40. Temperature sensor 26 may include measurement circuitry 42. Measurement circuitry 42 may be used to measure voltages at measurement nodes N1 and N2 of bridge circuit 74. Measurement circuitry 42 may include a differential amplifier having inputs coupled to nodes N1 and N2 and having an output coupled to an analog-to-digital converter, as one example. Measurement circuitry 42 may measure the resistance RV of RTD 30, which changes based on the temperature of the printed circuit at the location of the RTD. Measurement circuitry 42 may store the measured resistance RV for later processing if desired. Measurement circuitry 42 may also convert the measured resistance RV to a corresponding temperature (e.g., the temperature under which RTD 30 exhibits that measured resistance RV) and may store the temperature for later processing. Measurement circuitry 42 may determine/generate the temperature using the Callendar-Van Dusen equations or by comparing the measured resistance to stored data mapping resistance RV to temperature (e.g., for the corresponding conductive material in RTD 30). Measurement circuitry 42, power supply terminals VP and VN, and reference resistors 44 may all form part of DAQ 32. The components of DAQ 32 may be formed from components mounted to the surface of the printed circuit (e.g., the printed circuit on which RTD 30 is formed) and/or may be formed on other substrates or printed circuits that are separate from the printed circuit that includes RTD 30.

Figure 3:
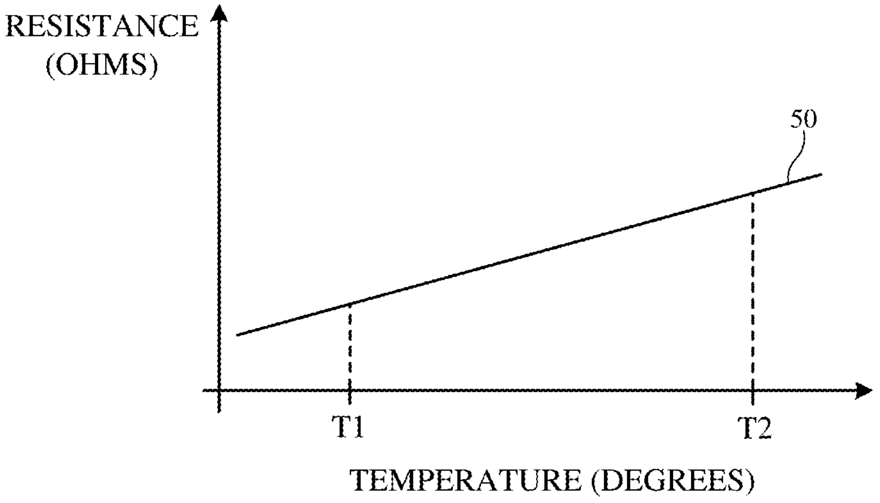
FIG. 3 is a plot of resistance as a function of temperature for an illustrative RTD in accordance with some embodiments.

FIG. 3 includes a curve 50 that plots resistance as a function of temperature for the conductive material used to form RTD 30. As shown by curve 50, the resistance of RTD 30 is linear between temperatures T1 and T2. Temperatures T1 and T2 may define the operating temperatures of the printed circuit on which RTD 30 is located. Temperatures T1 and T2 may be, for example, −50° C. and 150° C., respectively. While curve 50 and the TCR of RTD 30 is described herein as being linear, curve 50 and the TCR may be substantially linear if desired (e.g., the slope of curve 50 may be constant or may vary by a small amount such as around 1% or less between temperatures T1 and T2). Conductive materials such as Ni, Ni—Fe, and Pt may exhibit a resistance characterized by curve 50, as examples. These examples are merely illustrative and, in general, any desired conductive material having a resistance characterized by a linear curve between temperatures T1 and T2 such as curve 50 may be used to form RTD 30.

Figure 4:
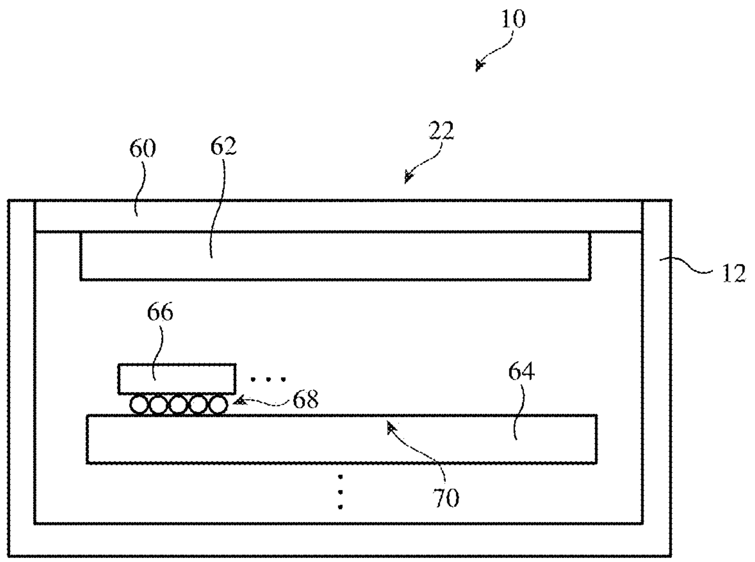
FIG. 4 is a cross-sectional side view of an illustrative electronic device having a printed circuit and electrical components mounted to the printed circuit in accordance with some embodiments.

FIG. 4 is a cross-sectional side view showing how a printed circuit may be mounted within device 4. As shown in FIG. 4, device 10 may have a housing such as housing 12 in which electrical components 66 are mounted. Electrical components 66 may include integrated circuits (chips), integrated circuit packages or other packages, SOCs, voltage regulators, processors, memory, connectors, sensors, input-output devices, some or all of control circuitry 14 of FIG. 1, some or all of wireless circuitry 34 of FIG. 1, and/or other circuitry. Components 66 may be mounted to one or more substrates such as printed circuit 64. Printed circuit 64 may be a rigid printed circuit board formed from fiberglass-filled epoxy, ceramic, or other rigid printed circuit board substrate material or may be a flexible printed circuit formed from a flexible layer of polyimide or flexible sheets of other polymer material.

Components 66 may be mounted to lateral surface 70 of printed circuit 64 (e.g., at the exterior of printed circuit 64). Components 66 may, for example, be mounted to lateral surface 70 using conductive interconnect structures 68. Conductive interconnect structures 68 may include solder balls (e.g., components 66 may be SMT components), a ball grid array (BGA), conductive pins, conductive clips, radio-frequency connectors, and/or using any other desired conductive interconnect structures for coupling components 66 to lateral surface 70. Conductive interconnect structures 68 may be coupled to contact pads on lateral surface 70 of printed circuit 64. Conductive interconnect structures 68 may be used to route data signals, radio-frequency signals, reference signals, power supply voltages, control signals, baseband signals, intermediate frequency signals, and/or any other desired signals between component 66 and other components 66 on printed circuit 64 or external to printed circuit 64 (e.g., over metallization layers and/or conductive vias in printed circuit 64).

Display 22 may include display layers 62 (e.g., liquid crystal display layers, an organic light-emitting diode display, an electrophoretic display, etc.). Display layers 62 may sometimes be referred to herein as display module 62. Display layers 62 may be mounted under display cover layer 60. Display cover layer 60 may be mounted to housing 12 and may be formed from a layer of glass, transparent plastic, sapphire or other transparent crystalline material, etc. If desired, printed circuit 64 may be a flexible printed circuit coupled to display layers 62 (e.g., a display flex that conveys display signals to display layers 62 to produce display light that is emitted through display cover layer 60). If desired, a flexible printed circuit (e.g., a display flex) may couple display layers 62 to printed circuit 64 (e.g., printed circuit 64 may be a main logic board for device 10 or may include display driver circuitry used to drive display layers 62 through the display flex).

During device operation, components 66 draw current and power that produces resistive heating at printed circuit 64. RTDs such as RTD 30 (FIGS. 1 and 2) may be mounted at one or more locations on lateral surface 70 and/or within the layers of printed circuit 64. The RTDs may be mounted at locations overlapping and/or adjacent to a corresponding component 66 to provide accurate measurements of the temperature of printed circuit 64 at locations where resistive heating is the highest. This may allow the control circuitry to accurately measure and track temperature in printed circuit 64 so that device operations can be selectively throttled when necessary to maximize the operating life and reliability of printed circuit 64.

Figure 5:
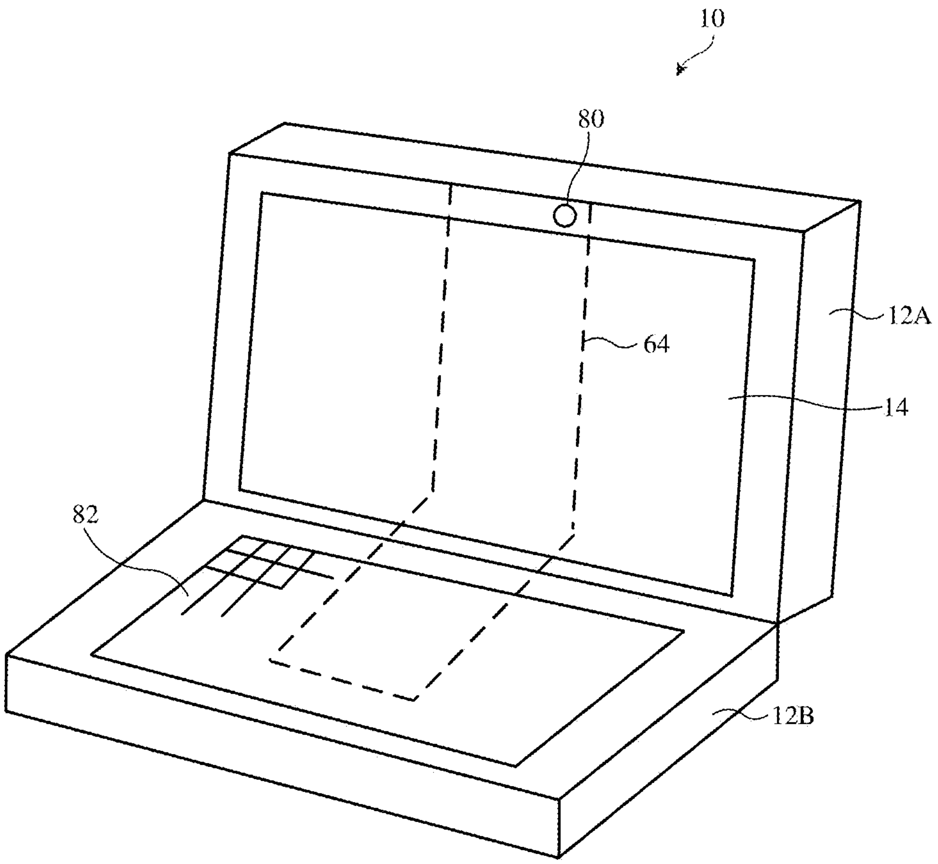
FIG. 5 is a perspective view of an illustrative electronic device having a printed circuit that extends between first and second housing portions in accordance with some embodiments.

The example of FIG. 4 is merely illustrative. Housing 12 may have other shapes. Display 22 may be omitted. If desired, printed circuit 64 may extend between multiple portions of housing 12, such as in embodiments where device 10 is a laptop computer. FIG. 5 is a perspective view of device 10 in configurations where device 10 is a laptop computer. As shown in FIG. 5, device 10 may have an upper housing portion (lid) 12A and a lower housing portion (base) 12B. Input-output devices 82 (e.g., a keyboard, trackpad, other buttons, etc.) may be disposed on lower housing portion 12B. A battery or other power supply circuitry may be also be disposed within lower housing portion 12B. Display 22 may be disposed on upper housing portion 12A. If desired, one or more sensors such as camera 80 may be disposed on upper housing portion 12A. Camera 80 may be a user-facing camera (e.g., webcam), as one example. Upper housing portion 12A may rotate with respect to lower housing portion 12B about a hinge axis or clutch barrel.

As shown in FIG. 5, printed circuit 64 may extend from the interior of lower housing portion 12B to the interior of upper housing portion 12A (e.g., across the hinge axis or clutch barrel). In this example, printed circuit 64 may be a display flex used to drive display 22, may be a speaker flex used to drive speakers in upper housing portion 12A, may be a camera flex used to mount camera 80 or any other sensors in upper housing portion 12A (e.g., camera 80 may be mounted to printed circuit 64), may be an antenna flex used to convey radio-frequency signals between upper housing portion 12A and lower housing portion 12B, or may convey any other desired signals between upper housing portion 12A and lower housing portion 12B. If desired, one or more RTDs 30 may be disposed at one or more locations on or within printed circuit 64 within upper housing portion 12A (e.g., to measure the temperature of the printed circuit when subjected to heating by display 22) and/or within lower housing portion 12B (e.g., to measure the temperature of the printed circuit when subjected to heating by the battery or other components in lower housing portion 12B). These examples are merely illustrative and, in general, device 10 may have any desired form factor.

Figure 6:
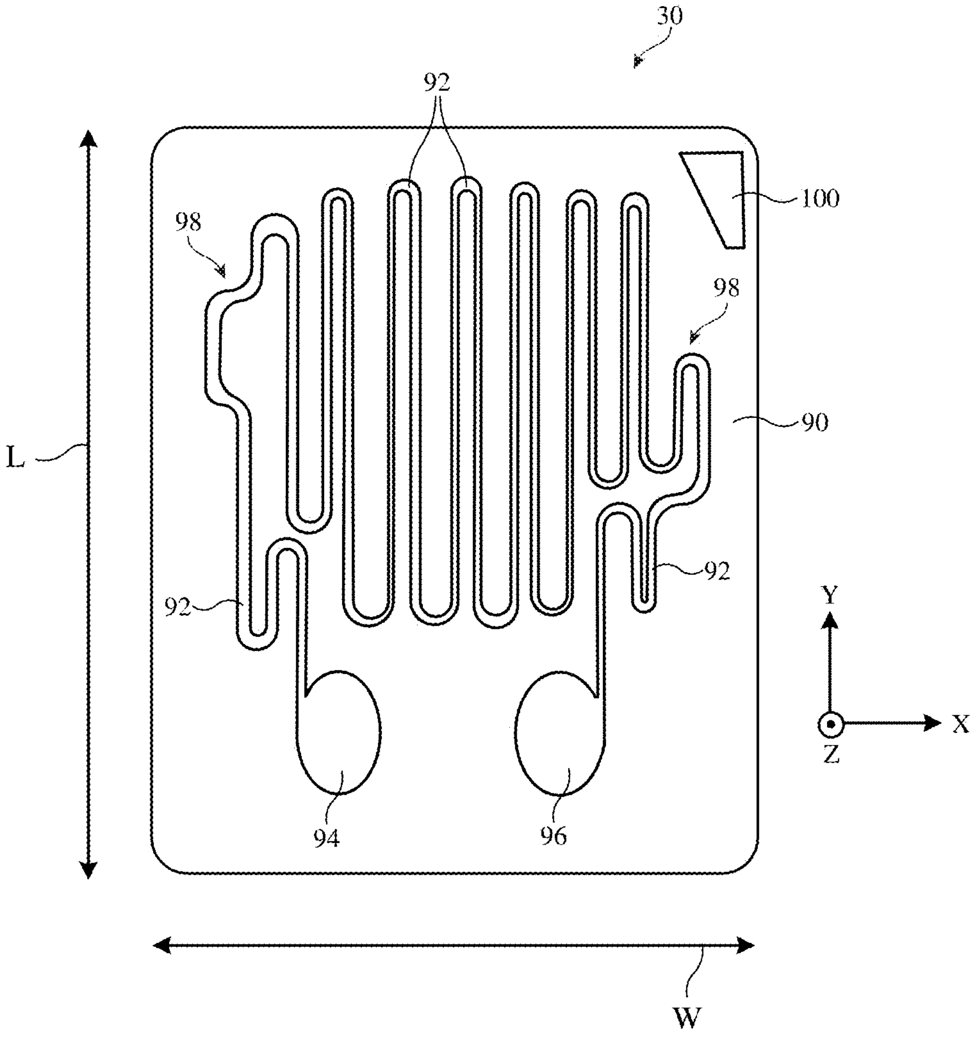
FIG. 6 is a top view of an illustrative RTD having a meandering conductive trace extending between contact pads on an underlying substrate in accordance with some embodiments.

An illustrative RTD such as RTD 30 of FIGS. 1 and 2 is shown in FIG. 6. As shown in FIG. 6, RTD 30 includes an elongated conductive trace 92 that extends from a first contact pad 94 to a second contact pad 96 on the lateral surface of an underlying substrate such as substrate 90. Substrate 90 may be flexible and inert and may include polyimide or other flexible polymers. The conductive material used to form conductive trace 92 has a linear resistance as a function of temperature over the operating temperatures of the printed circuit (e.g., the conductive material may be characterized by curve 50 of FIG. 3). As examples, conductive trace 92 may be formed from Ni, Ni—Fe, or Pt (e.g., conductive trace 92 may be an Ni trace, an Ni—Fe trace, or a Pt trace). RTD 30 may be fabricated using a silicon die wafer process, for example. Contact pads 94 and 96 may, for example, be copper-plated contact pads (e.g., where the copper plate serves as a stop for micro vias that are laser drilled into the printed circuit over the contact pads).

Conductive trace 92 may follow a meandering (e.g., serpentine) path between contact pads 94 and 96. As such, conductive trace 92 may include a series of interconnected segments that run parallel to the Y-axis and/or X-axis of FIG. 6. Conductive trace 92 may include one or more bends (e.g., around axes parallel to the Z-axis). Bends in conductive trace 92 may be used to maximize the amount of conductive material per lateral area on substrate 90 and thus the length of conductive trace 92. The length of conductive trace 92 may be selected to set the nominal resistance of RTD 30 (e.g., the resistance of RTD 30 at a predetermined temperature such as room temperature). The nominal resistance of RTD 30 may be between 200-400 Ohms, for example.

The example of FIG. 6 is merely illustrative and, in general, conductive trace 92 may have any desired number of segments extending in any desired directions, may follow any desired path having any desired shape, may have any desired number of bends, and may have edges with any desired shape. The layout of conductive trace 92 (e.g., the number and configuration of bends, the density of conductive traces on substrate 90, etc.) may be selected so that RTD 30 exhibits a desired length that configures RTD 30 to exhibit the nominal resistance. If desired, conductive trace 92 may include one or more trim features 98. Trim features 98 may be formed by routing portions of conductive trace 92 into pocket shapes, for example. Trim features 98 may be used to help configure RTD 30 to exhibit the desired length and thus the nominal resistance. Trim features 98 may be omitted if desired. RTD 30 may also include one or more visual alignment indicators 100 on substrate 90. Visual alignment indicator 100 may help to ensure that RTD 30 is properly aligned after lamination within a printed circuit.

RTD 30 may be embedded within printed circuit 64 or may be adhered to a surface of printed circuit 64 (FIGS. 4 and 5). At the same time, RTD 30 forms a part of bridge circuit 40 in temperature sensor 26 (FIG. 2). For example, contact pad 94 may be coupled to a reference resistor 44 and power supply terminal VP of bridge circuit 40 (e.g., reference resistor 44 and power supply terminal VP may form part of DAQ 32 and may be coupled to contact pad 94 over one or more conductive vias in the printed circuit and/or other conductive interconnect structures). Contact pad 96 may be coupled to node N2 of bridge circuit 40 (e.g., node N2 may form a part of DAQ 32 and may be coupled to contact pad 96 over one or more conductive vias in the printed circuit and/or other conductive interconnect structures). DAQ 32 may measure the resistance of conductive trace 92 across terminals such as contact pads 94 and 96. DAQ 32 may identify the temperature at RTD 30 (e.g., the temperature within printed circuit board 64) from the measured resistance.

RTD 30 (substrate 90) has a lateral area (footprint) defined by a length L and a perpendicular width W. Length L may be greater than width W or may be qual to width W. RTD 30 is relatively compact in size. For example, length L and width W may each be around 0.3-3 mm. This lateral size of RTD 30 may be on the same order of magnitude as an SMT capacitor or resistor. However, at the same time, RTD 30 is 10-100 times thinner than an SMT capacitor or resistor. RTD 30 may, for example, have a thickness (e.g., as measured parallel to the Z-axis) that is approximately 20-50 microns, 35-45 microns, less than 100 microns, less than 50 microns, less than 40 microns, etc. This may allow RTD 30 to be embedded within the layers of printed circuit 64 for measuring temperature at locations within the interior of printed circuit 64.

Strain gauge(s) 28 (FIG. 1) may also be embedded in the printed circuit for measuring strain on the printed circuit. The strain gauge also includes a meandering conductive trace between contact pads on an underlying substrate. When the printed circuit bends in response to strain, the bending alters the length of the conductive trace and thus the resistance of the strain gauge. DAQ 32 or a separate DAQ may measure these changes in resistance and may estimate the strain on the printed circuit based on the resistance. However, the conductive trace in the strain gauge is formed from metals such as nichrome, karma, or constantan that do not exhibit a linear resistance as a function of temperature across the operating temperatures of the printed circuit. RTD 30 may also occupy less lateral area than strain gauge 28 because, for the same nominal resistance value, the conductive material used in strain gauge 28 has higher resistance per unit length and thus RTD 30 will need a longer conductive trace to achieve the nominal resistive value (e.g., RTD 30 may occupy the lateral area of as many as three strain gauges 28).

Figure 7:
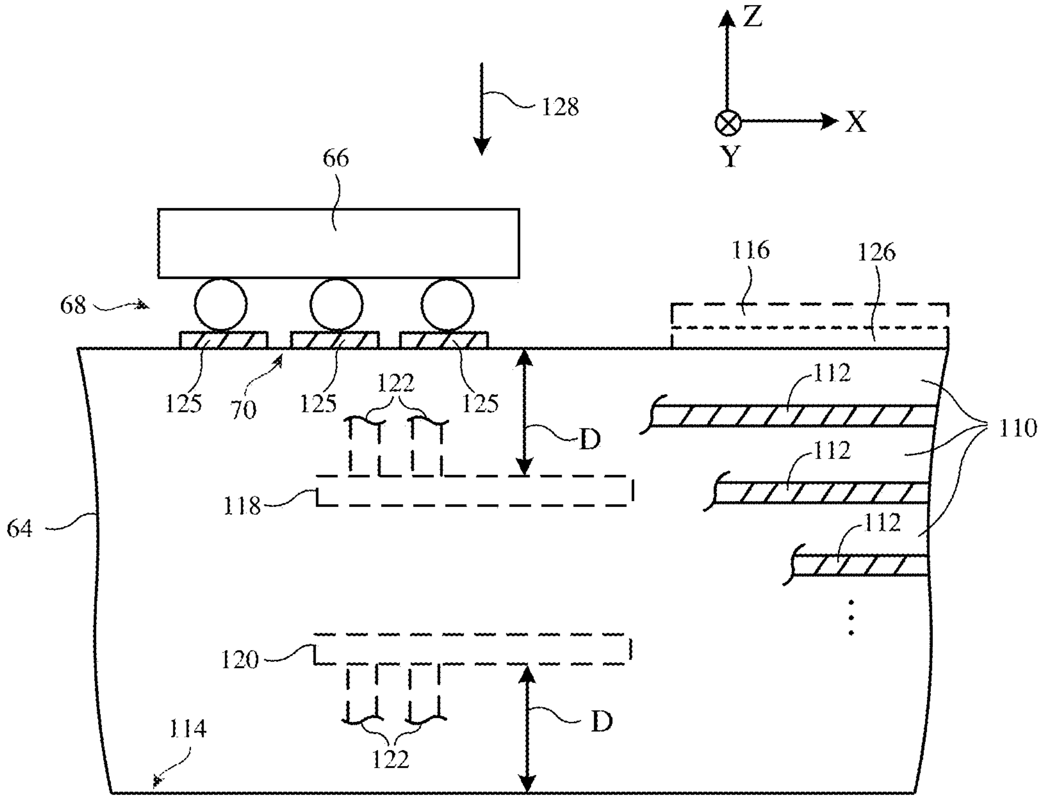
FIG. 7 is a cross-sectional side view of an illustrative printed circuit having one or more RTDs on and/or within the printed circuit in accordance with some embodiments.

FIG. 7 is a cross-sectional side view showing how RTD 30 may be disposed on printed circuit 64. As shown in FIG. 7, printed circuit 64 may include a set of stacked (laminated) dielectric layers 110. Dielectric layers 110 may be formed from a rigid material (e.g., fiberglass, ceramic, etc.) in embodiments where printed circuit 64 is a rigid printed circuit board or may be formed from a flexible material (e.g., polyimide, flexible polymer, etc.) in embodiments where printed circuit 64 is a flexible printed circuit.

Printed circuit 64 may also include a set of metal layers 112 (sometimes referred to herein as metallization layers) interspersed or interleaved among the dielectric layers. Metal layers 112 may include conductive (e.g., copper) traces patterned onto the surface of corresponding dielectric layers 110. The conductive traces in metal layers 112 may be used to route any desired signals, power supply voltages, etc. around the printed circuit. The conductive traces in metal layers 112 may also include ground traces. Conductive vias may be used to couple metal layers 112 together and/or to conductive components at the surface of printed circuit 64 through dielectric layers 110.

As shown in FIG. 7, printed circuit 64 may have contact pads 125 on lateral surface 70 (sometimes referred to herein as exterior surface 70 because it is the lateral surface of an outer-most dielectric layer 110 in printed circuit 64). Component 66 may be mounted to contact pads 125 using conductive interconnect structures 68 (e.g., conductive interconnect structures 68 may include a BGA, conductive pins, or solder balls coupled and/or affixed to contact pads 125). Conductive interconnect structures 68, contact pads 125, metal layers 112, and conductive through vias in dielectric layers 110 may be used to route signals between component 66 and other components mounted to a surface of printed circuit 64 or elsewhere in device 10. As current from these signals pass through metal layers 112, the current produces Ohmic (resistive) heating in printed circuit 64. This heating may be particularly pronounced at one or more points (hotspots) within printed circuit 64 such as locations at or adjacent to component 66, locations within the interior of printed circuit 64 and overlapping component 66, etc.

In order to fully monitor the temperature of printed circuit 64, RTDs 30 may be disposed at each of the hotspots within printed circuit 64. For example, a first RTD 30 may be embedded within printed circuit 64 at location 118. When at location 118, RTD 30 may partially or completely overlap electrical component 66 (e.g., when viewed in the direction of arrow 128). RTD 30 may be sufficiently thin (in the Z-direction) so as to allow RTD 30 to be fully laminated within the layers of printed circuit 64 while still retaining a flat or planar profile. RTD 30 may, for example, overlap or be placed beneath SMT pin pads of a BGA having high current power and ground solder ball pins (e.g., pins that support currents as high as 5 A/pin or higher). Location 118 may be at a distance D from lateral surface 70 (e.g., a depth within the printed circuit where current density and thus resistive heating is highest). Distance D may be a few mm, a few microns, etc. Distance D may be less than, equal to, or greater than half the thickness of printed circuit 64. Conductive through vias such as conductive vias 122 (e.g., micro vias) may couple contact pads 94 and 96 of RTD 30 (FIG. 6) to DAQ 32 (e.g., conductive vias 122 may extend to lateral surface 70 or may couple RTD 30 to DAQ 32 through conductive traces in one or more metal layers 112 and additional conductive vias that extend to lateral surface 70).

In another suitable implementation, RTD 30 may be embedded at location 120 within printed circuit 64 at distance D from lateral surface 114 (e.g., the lateral surface of printed circuit 64 opposite lateral surface 70). Location 120 may at least partially overlap component 66. In other words, when RTD 30 is at location 118 or location 120, RTD 30 may partially overlap component 66 or an entirety of RTD 30 may overlap component 66 (e.g., RTD 30 may completely overlap component 66). This is merely illustrative and, in general, locations 118 and 120 need not overlap component 66. Location 120 may additionally or alternatively at least partially overlap an additional component mounted to lateral surface 114.

If desired, RTD 30 may be mounted to lateral surface 70 such as at location 116. When mounted to lateral surface 70, a layer of glue or adhesive 126 may be used to affix RTD 30 to lateral surface 70. Printed circuit 64 may include one RTD 30 or more than one RTD 30 (e.g., dozens of RTDs, hundreds of RTDs, a few RTDs, etc.). RTDs 30 may be mounted at location 118, location 120, location 116, and/or any other desired locations on/within printed circuit 64 (e.g., at each current density hotspot and/or at any other desired locations on printed circuit 64). Embedding RTDs 30 into printed circuit 64 in this way may allow temperature sensor 26 to measure the temperature of printed circuit 64 at high current density locations such as locations within the printed circuit. SMT temperature sensors soldered to the exterior surface of printed circuit 64 are unable to measure the temperature of printed circuit 64 at these locations.

Figure 8:
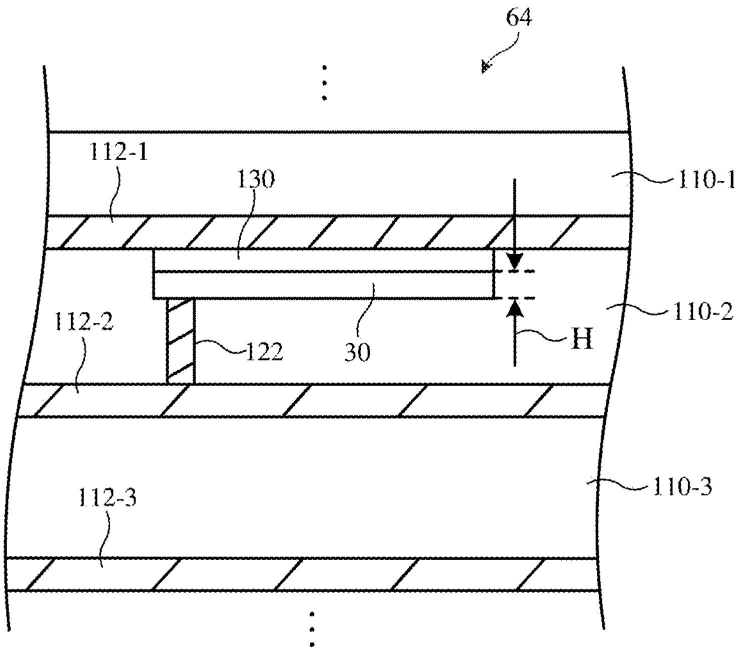
FIG. 8 is a cross-sectional side view showing how an illustrative RTD may be laminated within the layers of a printed circuit in accordance with some embodiments.

FIG. 8 is a cross-sectional side view showing how RTD 30 may be laminated within the layers of printed circuit 64. As shown in FIG. 8, printed circuit 64 may include dielectric layers 110 such as a first dielectric layer 110-1, a second dielectric layer 110-2 stacked under dielectric layer 110-1, and a third dielectric layer 110-3 stacked under dielectric layer 110-2. Metal layers 112 may be patterned onto dielectric layers 110. For example, a first metal layer 112-1 may be patterned onto the top surface of dielectric layer 110-2 (or the bottom surface of layer 110-1), a second metal layer 112-2 may be patterned onto the top surface of dielectric layer 110-3 (or the bottom surface of layer 110-2), a third metal layer 112-3 may be patterned onto the bottom surface of dielectric layer 110-3, etc. Additional dielectric layers 110 and/or metal layers 112 may be stacked over dielectric layer 110-1 and/or stacked under metal layer 112-3. Layers 110-1, 110-3, and/or 112-3 may be omitted if desired.

RTD 30 (e.g., substrate 90 and/or conductive trace 92 of FIG. 6) may be coupled to metal layer 112-1 using a layer of adhesive such as adhesive 130. Dielectric layer 110-2, metal layer 112-2, and additional layers of printed circuit 64 (e.g., dielectric layer 110-3, metal layer 112-3, additional layers under metal layer 112-3, etc.) may be layered under RTD 30 and metal layer 112-1. Conductive via 122 may couple the contact pads on RTD 30 to metal layer 112-2, to other metal layers 112 in printed circuit 64, and/or to contact pads on an exterior surface of the printed circuit). Adhesive 130 may be a heat and/or pressure activated adhesive, for example.

During manufacture of printed circuit 64, RTD 30 may be deposited onto adhesive 130 using double sided tape or other manufacturing equipment. In this example, metal layer 112-1, dielectric layer 110-1, and the metal layers 112 and dielectric layers 110 stacked over dielectric layer 110-1 may form a multilayer core of printed circuit 64. Dielectric layer 110-2 and any dielectric or metal layers under dielectric layer 110-2 are then laminated under RTD 30 and metal layer 112-1. A heat press may be used to activate adhesive 130 and to adhere each of the layers together, for example. Milling equipment or other equipment may cut through vias into at least layer 110-2 and the through vias may be filled with conductive material to form conductive vias 122. The silicon die wafer process used to form RTD 30 may configure RTD 30 to have a relatively thin thickness H (e.g., around 39 microns, 35-45 microns, less than 50 microns, etc.), thereby allowing RTD 30 to be embedded within printed circuit 64 in this way without requiring a cavity or recess to be cut into dielectric layer 110-2 to accommodate the RTD.

Figure 9:
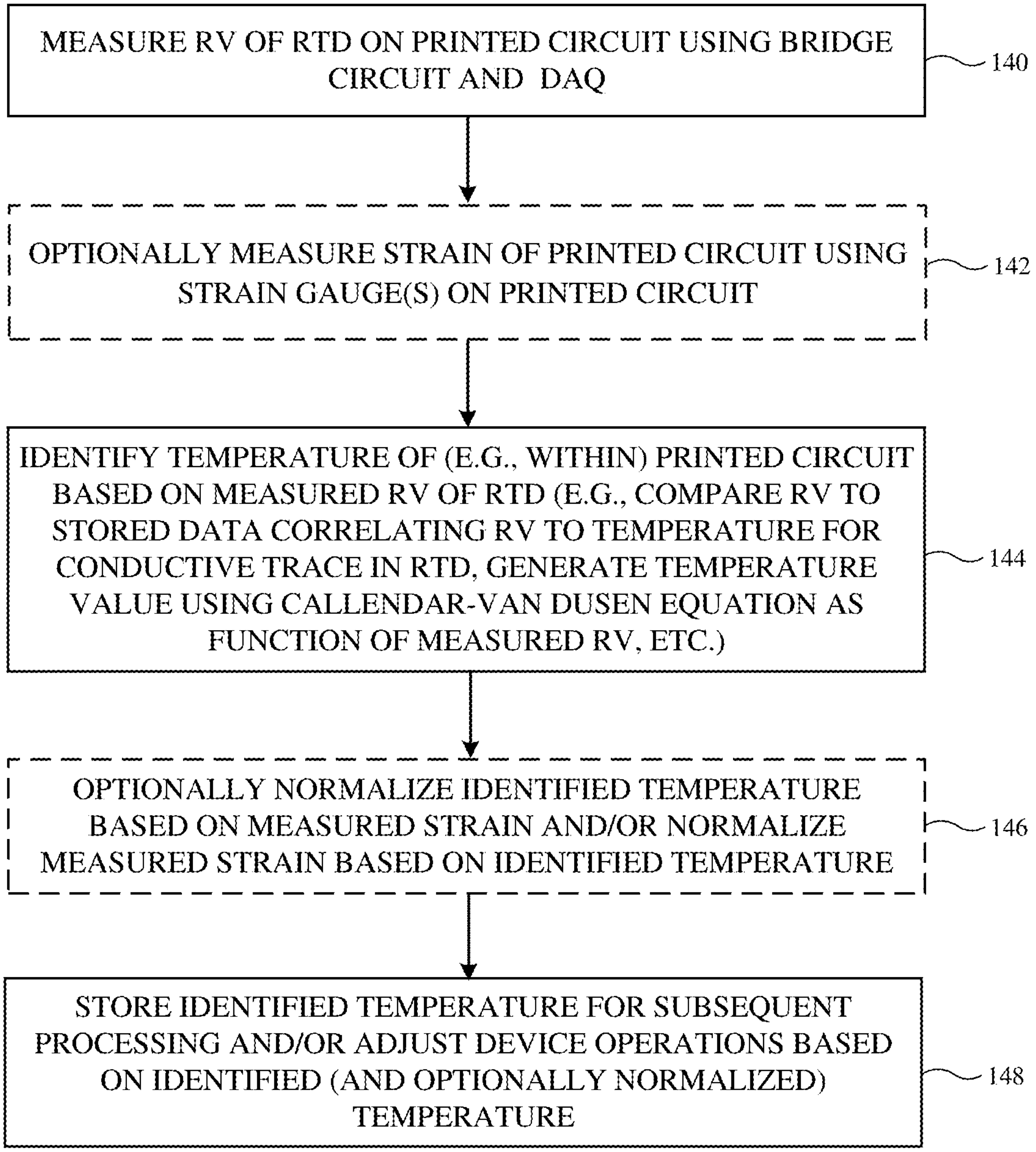
FIG. 9 is a flow chart of illustrative operations involved in measuring temperature using an RTD on a printed circuit in accordance with some embodiments.

FIG. 9 is a flow chart of illustrative operations that may be performed by DAQ 32 to identify temperature on/within printed circuit 64 using RTD 30. At operation 140, DAQ 32 (e.g., measurement circuitry 42 of FIG. 2) may measure the voltage across contact pads 94 and 96 (FIG. 6) to measure the resistance RV of RTD 30 in bridge circuit 40. The resistance RV of conductive trace 92 in RTD 30 depends on the temperature of RTD 30 (e.g., due to resistive heating within printed circuit 64 due to current drawn by component 66).

At optional operation 142, DAQ 32 or a separate DAQ may measure strain on printed circuit 64 using one or more strain gauges 28 (FIG. 1). The strain measurements may be used to identify wear and tear on printed circuit 64, drop events or other mechanical stress events on device 10, etc. The strain measurements may be stored (e.g., at storage circuitry 16 of FIG. 1) for later processing.

At operation 144, control circuitry 14 (e.g., DAQ 32, one or more processors, other control circuitry in device 10, etc.) may identify (e.g., determine, calculate, compute, generate, or infer) the temperature of RTD 30 and thus within printed circuit 64 based on the measured resistance RV of RTD 30. If desired, control circuitry 14 may store predetermined tables or curves (e.g., curve 50 of FIG. 3) that map the resistance of the conductive material in conducive trace 92 to temperature. For example, control circuitry 14 may identify the temperature corresponding to the measured resistance RV on curve 50 or may interpolate the temperature corresponding to resistance RV using a set of stored points on curve 50. The temperature identified at operation 144 may sometimes be referred to herein as identified temperature, measured temperature, an identified temperature value, or a measured temperature value.

Additionally or alternatively, control circuitry 14 may calculate the temperature of RTD 30 using the Callendar-Van Dusen equation (e.g., using the measured resistance RV as an input to the Callendar-Van Dusen equation). In other words, control circuitry 14 may identify (e.g., generate, compute, or calculate) the temperature of RTD 30 by solving for temperature T in the Callendar-Van Dusen equation, which is shown in equation 1.

$$RV = R0\left[1 + AT + BT^2 + C(T - 100^\circ\ \mathrm{C.})T^3\right] \tag{1}$$

In equation 1, temperature T is in units of ° C., R0 is the resistance of the conductive material in conductive trace 92 at 0° C., and A, B, and C are Callendar-Van Dusen constants that are empirically derived for the given material in conductive trace 92 based on the measured resistance of the material at 0° C., 100° C., and 260° C. Calculating temperature T using the Callendar-Van Dusen equation may be more precise than performing interpolation on stored data curves, for example.

In general, if care is not taken, non-zero strain applied to printed circuit 64 affects the resistance RV of RTD 30 and thus the temperatures identified by temperature sensor 26 (e.g., because the strain may cause small changes in the length of conductive trace 92). Similarly, different temperatures affect the resistance of strain gauge 28 and thus the strain measurements gathered using strain gauge 28 (e.g., because of thermal expansion of the conductive material in the strain gauge). At optional operation 146, control circuitry 14 may normalize the identified temperature based on strain measured at operation 142 and/or may normalize the strain measured at operation 142 based on the temperature identified at operation 144.

Control circuitry 14 may normalize the identified temperature value by applying (e.g., adding) an offset value to the identified temperature value that is based on the measured strain (e.g., as measured by a strain gauge adjacent to RTD 30 in printed circuit 64). If desired, the offset value may be identified using a stored curve that plots the effect of strain on temperature for conductive trace 92 (e.g., as predetermined experimentally). Control circuitry 14 may also calculate the offset value based on the measured strain (e.g., using a fourth order thermal compensation polynomial, etc.). Additionally or alternatively, control circuitry 14 may normalize the measured strain by applying (e.g., adding) an offset value to the measured strain that is based on the identified temperature value (e.g., as measured by an RTD 30 adjacent to the strain gauge in printed circuit 64). This offset value may also be identified using a stored curve that plots the effect of temperature on strain for conductive traces in strain gauge 38 or may be calculated as a function of the identified temperature value.

At operation 148, control circuitry 14 may store the identified temperature for subsequent processing and/or may adjust device operations based on the identified temperature. For example, control circuitry 14 may track temperature over time to analyze the heating patterns within printed circuit 64. Control circuitry 14 may reduce current/power drawn by one or more components 66 and/or by other components in device 10 (e.g., by disabling or powering off some or all of the component, reducing the number or speed of processing tasks performed by the component, terminating applications running on the component, reducing power supply voltages, disabling or reducing brightness on display 22 of FIGS. 4 and 5, etc.) when the identified temperature value exceeds a predetermined threshold value. This may serve to prevent overheating in device 10 and potential damage to printed circuit 64 or other components in device 10, while also preserving battery life and maximizing the operating life of printed circuit 64 and the other components in device 10.

When multiple RTDs 30 are disposed on printed circuit 64, control circuitry 14 may also identify subsets of the printed circuit and/or subsets of the components 66 mounted to the printed circuit that are producing excessive resistive heating. Control circuitry 14 may thereby reduce current/power drawn by the identified subset of the components 66 or by other components on the identified subset of the printed circuit (e.g., without affecting operation of the other components 66 on printed circuit 64). If desired, switching circuitry may be used to route signals away from overheated portions of printed circuit 64 and towards portions of printed circuit 64 that are at relatively low temperatures. If desired, control circuitry 64 may monitor the identified temperature across and within printed circuit 64 over time to assess the general health of the printed circuit, components 66, and device 10 over time. RTD 30 may allow control circuitry 14 to identify the temperature at locations within the interior of printed circuit 64 where resistive heating may be the highest. These locations are otherwise inaccessible to SMT temperature sensors.

Figure 10:
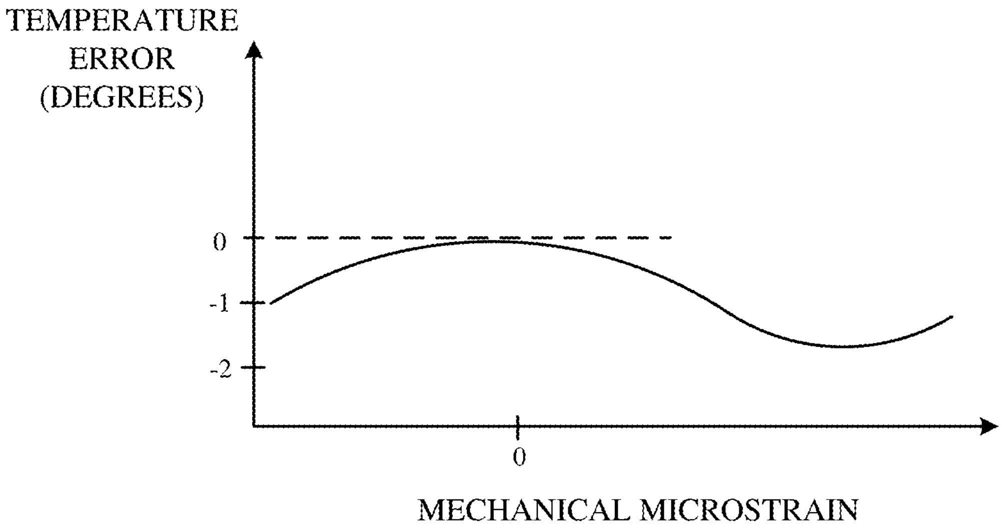
FIG. 10 is a plot of temperature error for temperature values measured by an illustrative RTD on a printed circuit as a function of mechanical microstrain on the printed circuit in accordance with some embodiments.

FIG. 10 is a plot of temperature error for temperature values measured by RTD 30 as a function of mechanical microstrain on printed circuit 64. The curve of FIG. 10 may be predetermined and generated experimentally, for example. The curve of FIG. 10 or similar data plotting temperature error as a function of mechanical microstrain may be stored on device 10 for use during temperature measurement normalization. As shown by the curve of FIG. 10, there may be no error or relatively little error in temperature measurements by RTD 30 when printed circuit 64 is subject to no microstrain. As non-zero microstrain is applied, the strain may produce changes in the resistance RV of RTD 30 that are unassociated with temperature, leading to the error in the temperature values identified by control circuitry 14 as shown by the curve of FIG. 10. The temperature error shown in FIG. 10 may correspond to temperature offsets that are added to the temperature values identified by RTD 30. For example, when strain gauge 38 measures a non-zero strain, control circuitry 14 may use the curve of FIG. 10 to identify the temperature error corresponding to that measured strain. Control circuitry 14 may then normalize the measured temperature value by adding an offset to the measured temperature value that compensates for the identified temperature error. The example of FIG. 10 is merely illustrative. The curve of FIG. 10 may have other shapes in practice.

The methods and operations described above in connection with FIGS. 1-9 may be performed by the components of device 10 using software, firmware, and/or hardware (e.g., dedicated circuitry or hardware). Software code for performing these operations may be stored on non-transitory computer readable storage media (e.g., tangible computer readable storage media) stored on one or more of the components of device 10 (e.g., storage circuitry 16 of FIG. 1). The software code may sometimes be referred to as software, data, instructions, program instructions, or code. The non-transitory computer readable storage media may include drives, non-volatile memory such as non-volatile random-access memory (NVRAM), removable flash drives or other removable media, other types of random-access memory, etc. Software stored on the non-transitory computer readable storage media may be executed by processing circuitry on one or more of the components of device 10 (e.g., processing circuitry 18 of FIG. 1, etc.). The processing circuitry may include microprocessors, central processing units (CPUs), application-specific integrated circuits with processing circuitry, or other processing circuitry.

The foregoing is merely illustrative and various modifications can be made to the described embodiments. The foregoing embodiments may be implemented individually or in any combination.

What is claimed is:

1. A printed circuit board comprising:

a first layer;

a second layer on the first layer;

a component surface-mounted to the first layer; and a resistive thermal device (RTD) between the first and second layers, wherein the RTD at least partially overlaps the component.

2. The printed circuit board of claim 1, wherein the RTD comprises:

a flexible printed circuit between the first and second layers; and a conductive trace on the flexible printed circuit.

3. The printed circuit board of claim 2, wherein the conductive trace comprises one or more bends.

4. The printed circuit board of claim 3, wherein the conductive trace follows a meandering path.

5. The printed circuit board of claim 4, wherein the conductive trace has a resistance that varies linearly as a function of temperature across a range of temperatures.

6. The printed circuit board of claim 1, wherein an entirety of the RTD overlaps the component.

7. The printed circuit board of claim 1, wherein the component is soldered to one or more contact pads on the first layer.

8. Apparatus comprising:

a first dielectric layer;

a second dielectric layer;

a component mounted to a surface of the first dielectric layer; and a resistive thermal device (RTD) laminated between the first and second dielectric layers.

9. The apparatus of claim 8, wherein the RTD is configured to measure heat produced by the component.

10. The apparatus of claim 8, wherein the RTD at least partially overlaps the component.

11. The apparatus of claim 8, wherein the component is adjustable based on a temperature measured using the RTD.

12. The apparatus of claim 8, wherein the RTD comprises a conductive trace on a flexible printed circuit that is different from the first and second dielectric layers.

13. The apparatus of claim 8, wherein the first and second dielectric layers are rigid.

14. The apparatus of claim 8, wherein the first and second dielectric layers comprise polyimide.

15. A printed circuit board comprising:

a stack of layers including a first layer and a second layer;

at least one contact on the first layer and configured to receive a surface-mounted component;

first and second contact pads between the first and second layers; and a meandering conductive trace extending from the first contact pad to the second contact pad, the meandering conductive trace having a resistance that varies linearly as a function of temperature across a range of operating temperatures.

16. The printed circuit board of claim 15, wherein the range of operating temperatures comprises a range of operating temperatures of the surface-mounted component.

17. The printed circuit board of claim 16, wherein the meandering conductive trace at least partially overlaps the at least one contact pad on the first layer.

18. The printed circuit board of claim 15, wherein the meandering conductive trace at least partially overlaps the at least one contact pad on the first layer.

19. The printed circuit board of claim 15, wherein the first and second contact pads and the meandering conductive trace are disposed on the second layer.

20. The printed circuit board of claim 15, further comprising:

a flexible printed circuit substrate between the first and second layers, wherein the first and second contact pads and the meandering conductive trace are disposed on the flexible printed circuit substrate.

* * * * *